(12) United States Patent
Fierro (10) Patent No.: US 8,199,262 B2
(45) Date of Patent: Jun. 12, 2012

(54) FILTER FRAME AND DISPLAY HEAD ASSEMBLY

(75) Inventor: Adam Fierro, Placitas, NM (US)

(73) Assignee: Honeywell International Inc., Morristown, NJ (US)

( * ) Notice: Subject to any disclaimer, the term of this patent is extended or adjusted under 35 U.S.C. 154(b) by 1545 days.

(21) Appl. No.: 11/650,181

(22) Filed: Jan. 4, 2007

(65) Prior Publication Data

US 2008/0297996 A1 Dec. 4, 2008

(51) Int. Cl.
  *H04N 5/64* (2006.01)
  *G02F 1/1333* (2006.01)
  *G01C 21/00* (2006.01)
(52) U.S. Cl. ......... 348/837; 348/842; 349/104; 340/971
(58) Field of Classification Search .................. 349/104, 349/110; 348/786, 834, 835, 842, 837; 361/679.02, 361/829, 679.24; 340/971; 362/470, 471
See application file for complete search history.

(56) References Cited

U.S. PATENT DOCUMENTS

| 4,532,513 | A | * | 7/1985 | Halvorson | 340/971 |
| 5,699,131 | A | * | 12/1997 | Aoki et al. | 348/832 |
| 5,754,259 | A | * | 5/1998 | Nakamatsu et al. | 348/835 |
| 6,229,085 | B1 | * | 5/2001 | Gotoh et al. | 174/353 |
| 7,492,356 | B1 | * | 2/2009 | Pruitt | 345/172 |
| 7,679,891 | B2 | * | 3/2010 | Hamada et al. | 361/679.21 |
| 7,885,056 | B2 | * | 2/2011 | Bopp | 361/679.01 |
| 2005/0243413 | A1 | * | 11/2005 | Shimizu et al. | 359/385 |
| 2006/0198088 | A1 | * | 9/2006 | Anderson et al. | 361/681 |
| 2008/0298001 | A1 | * | 12/2008 | Choi | 361/681 |

FOREIGN PATENT DOCUMENTS

FR 2811089 A1 * 1/2002

* cited by examiner

*Primary Examiner* — Eileen D Lillis
*Assistant Examiner* — Ryan Kwiecinski
(74) *Attorney, Agent, or Firm* — Ingrassia Fisher & Lorenz, P.C.

(57) ABSTRACT

A filter frame is provided suitable for use in conjunction with a light filter and a display head assembly including a display head and a bezel. The filter frame comprises a frame member configured to removably hold the light filter between the display head and the bezel. At least one guide member is fixedly coupled to the frame member and configured to engage a peripheral portion of the light filter to retain the light filter within the frame member.

16 Claims, 6 Drawing Sheets

FILTER FRAME AND DISPLAY HEAD ASSEMBLY

TECHNICAL FIELD

The present invention relates to display systems and, more particularly, to a filter frame suitable for use in conjunction with a display head assembly.

BACKGROUND

To enable piloting of an aircraft, the aircraft cockpit is typically provided with various flight controls (e.g., one or more flight yokes) and instrumentation, which often includes a considerable number of back-lit display systems. A representative aircraft display system comprises a display head assembly, which is mounted on a chassis. The display head assembly typically comprises a bezel and a display head, which includes a housing and display screen (e.g., a liquid crystal display) mounted within the housing. The bezel is coupled to the face of the display head and may include various controls for operating the display (e.g., display brightness, gain, contrast, etc.).

Aircraft display systems of the type described are known to emit stray light. Stray light emissions must often be managed to reduce glare and to minimize interference with light-sensitive night vision systems that may be deployed on the aircraft. Consequently, aircraft regulations may require that the quantity of light reaching a particular area of the cockpit (e.g., the region occupied by the pilot or co-pilot) does not exceed a predetermined threshold. For this reason, light filters may be employed to reduce the emission of stray light. Light filters may reduce the quantity of stray light reaching a particular area of the cockpit by, for example, only permitting light to pass through the filter at angles falling within a predetermined range of viewing angles. Such light filters are most effective when they are placed adjacent the display screen. As used herein, the term light filter includes filter elements that may block various spectra of electromagnetic radiation, including, but not necessarily limited to, electromagnetic radiation falling within the visible, ultraviolet, and infrared spectrums. For example, visible light filters may block green, blue, and red wavelengths of light to accommodate night vision optics. Other filters may include clear plastic with etched target markings or screen print target markings for different test procedures and photometer readings. Certain light filters (e.g., black plastic, mirror, and wood filters) may also be employed to completely block out light or to shield the display from sun or excessive heat. Furthermore, a metal shield filter may be employed to prevent display from being physically damaged (e.g., by pilot trying to enter cockpit).

Light filters are conventionally mounted to a display head assembly by attaching the light filter directly to the display screen with, for example, a Velcro fastener, double-sided tape, lace tape, or the like. Attaching the light filter to the display screen in this manner is relatively cumbersome. In addition, such attachment means may be somewhat unreliable and may result in visual obstruction of the display screen. Furthermore, these techniques do not allow the light filter to be easily replaced or reoriented (e.g., to change the angles at which the filter blocks stray light).

Considering the foregoing, it should be appreciated that it would be desirable to provide a filter frame capable of being retrofitted to an existing display head assembly, which may reliably secure a light filter in front of the assembly's display screen and which readily permits manual replacement or reorientation of the light filter. It would also be desirable to provide a display head assembly including a display head and bezel that cooperate to form a filter frame suitable for removably holding a light filter adjacent the display screen. Other desirable features and characteristics of the present invention will become apparent from the subsequent detailed description of the invention and the appended claims, taken in conjunction with the accompanying drawings and this background of the invention.

BRIEF SUMMARY

A filter frame is provided suitable for use in conjunction with a light filter and a display head assembly including a display head and a bezel. The filter frame comprises frame member configured to removably hold the light filter between the display head and the bezel. At least one guide member is fixedly coupled to the frame member and configured to engage a peripheral portion of the light filter to retain the light filter within the frame member.

BRIEF DESCRIPTION OF THE DRAWINGS

The preferred exemplary embodiment of the present invention will hereinafter be described in conjunction with the appended drawings, where like designations denote like elements, and.

DETAILED DESCRIPTION

The following detailed description is merely exemplary in nature and is in no way intended to limit the invention or the application and uses of the invention. Furthermore, there is no intention to be bound by any expressed or implied theory presented in the preceding technical field, background, brief summary, or the following detailed description.

Figure 1:
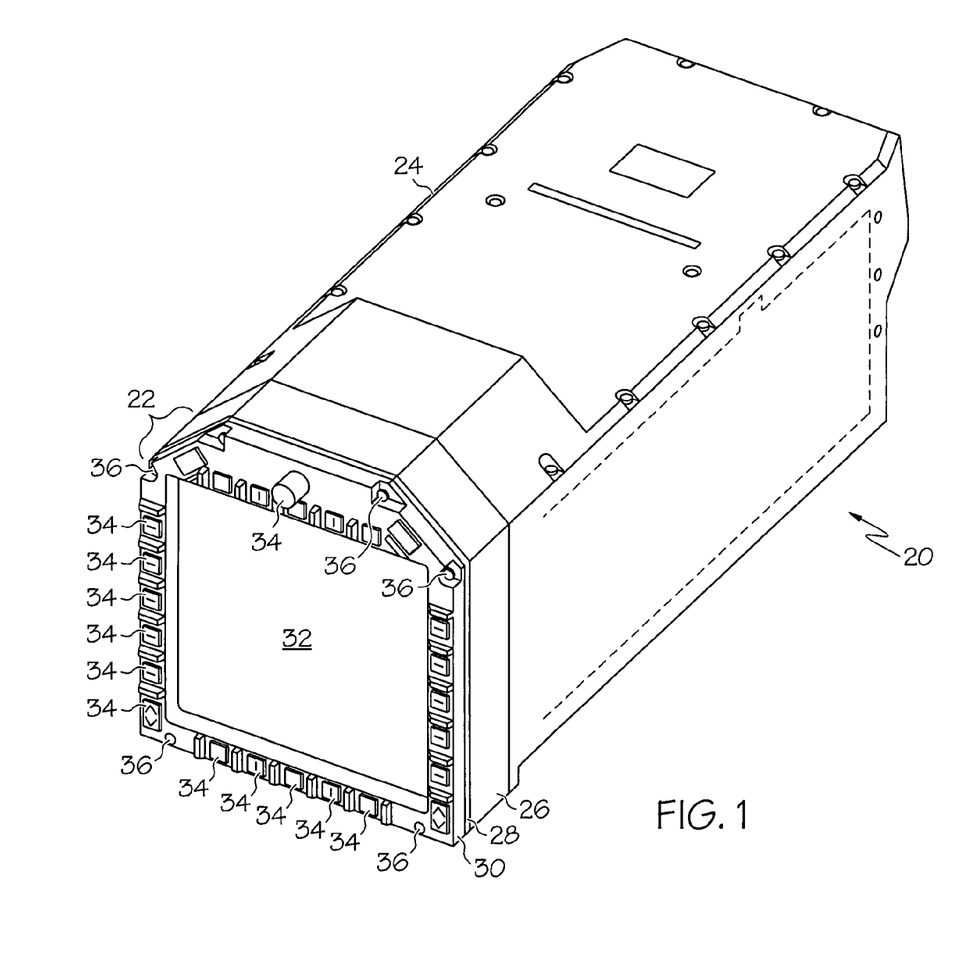
FIG. 1 is an isometric view of an aircraft display system including a filter frame in accordance with a first exemplary embodiment of the present invention.

FIG. 1 is an isometric view of a display system 20 including a filter frame 28 in accordance with a first exemplary embodiment of the present invention. Display system 20 is particularly suited for deployment in the cockpit of an aircraft and will thus be referred to herein as an aircraft display system; however, it should be understood that display system 20 may be deployed in other contexts (e.g., in military vehicles utilizing night vision systems) and, more generally, that the exemplary embodiments of the filter frame and display head assembly described below may be utilized in conjunction with a wide variety of display systems regardless of the particular environments in which the display systems are employed.

Aircraft display system 20 comprises a display head assembly 22 operatively coupled to chassis 24. In the illustrated exemplary embodiment, display head assembly 22 comprises: (1) a display head 26, (2) a filter frame 28, and (3) a bezel 30. Display head 26 includes a display screen 32 (e.g., a back-lit liquid crystal display), and bezel 30 includes a plurality of display controls 34 disposed thereon that may be accessed by a user (e.g., a pilot) to control various aspects of display screen 32 (e.g., contrast, brightness, gain, etc.). As will be explained more fully below, filter frame 28 is configured to removably hold a light filter in front of and adjacent to display screen 32. Filter frame 28 may be mounted between display head 26 and bezel 30 as shown in FIG. 1; e.g., a back surface of frame 28 may abut a front surface of display head 26, and a front surface of frame 28 may abut a back surface of bezel 30. Filter frame 28 may thus be retrofitted to a pre-existing display system by removing the bezel, mounting frame 28 to the display head, and then replacing the removed bezel. A plurality of fasteners (e.g., screws) 36 may be utilized to join display head 26, filter frame 28, and bezel 30.

Figure 2:
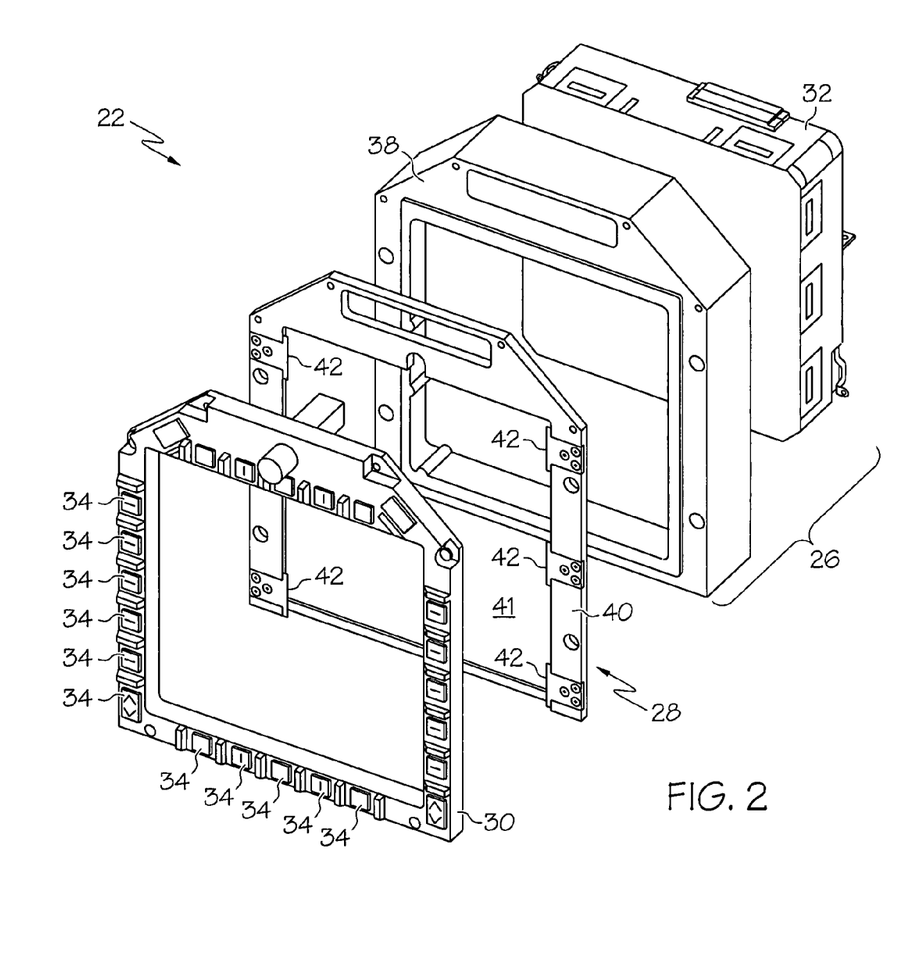
FIG. 2 is an exploded view of the display head assembly shown in FIG. 1.

FIG. 2 is an exploded view of display head assembly 22. In this view, it can be seen that display head 26 includes a display head housing 38 within which display screen 32 is mounted. It can also be seen that filter frame 28 comprises a frame member 40 having a viewing window 41 therethrough. One or more guide members 42 are coupled to frame member 40. As will be explained below, guide members 42 engage a peripheral portion of a light filter inserted into frame member 40 to retain the filter within window 41. The dimensions of filter frame 28 and the dimensions of window 41 will, of course, vary in relation to the particular display system with which filter frame 28 is utilized. For example, the height and width of window 41 may be substantially equivalent to the height and width of display screen 32 (FIG. 1); e.g., 4 inches by 4 inches. Filter frame 28 may be formed from a wide variety of materials, including, but not limited to, various alloys and metals (e.g., aluminum).

Figure 3:
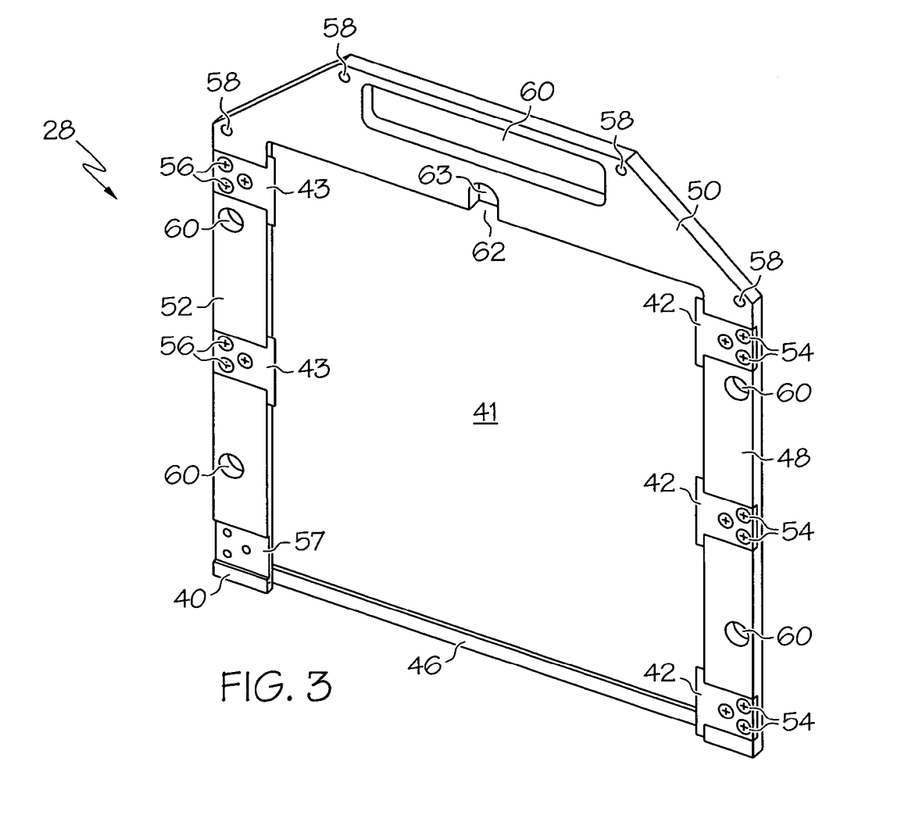
FIG. 3 is an isometric view of the filter frame shown in FIGS. 1 and 2.
Figure 4:
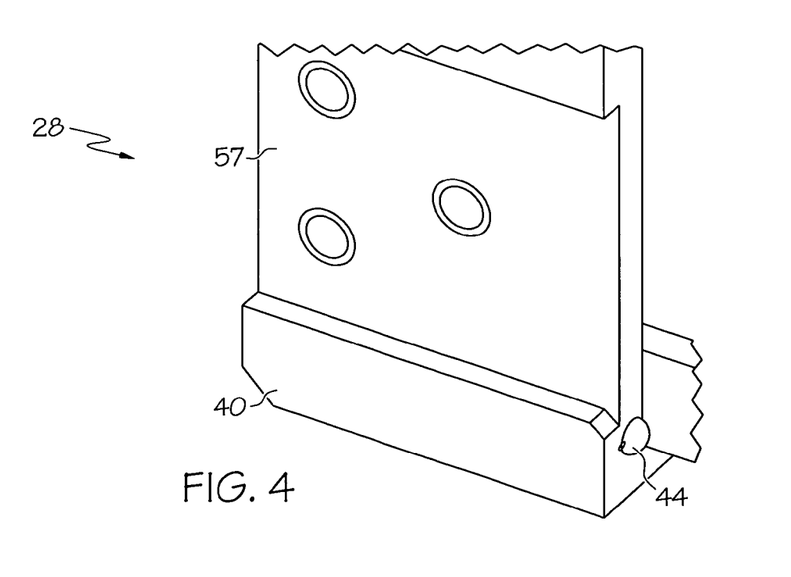
FIG. 4 is a detailed isometric view of a portion of the filter frame shown in FIG. 3 illustrating a detent feature incorporated into the filter frame.

FIG. 3 is an isometric view of filter frame 28 having a guide member 42 removed therefrom (shown at 57), and FIG. 4 is a detailed isometric view of a portion of filter frame 28 wherein a locking feature (e.g., a detent) 44 has been integrated into frame member 40. Frame member 40 may comprise, for example, four walls or sides 46, 48, 50, and 52. When frame member 40 is coupled between display head 26 and bezel 30, sides 50 and 46 may reside proximate the upper and lower portions, respectively, of display head assembly 22. Side 46 is partially open to permit the reception of a light filter therethrough; thus, the width of the opening through side 46 may be substantially equivalent to that of the light filter to be received therethrough. Sides 48 and 52 are coupled (e.g., integrally) between opposite ends of side 50 and side 46 to form a generally rectangular body as shown in FIGS. 2 and 3, although frame member 40 may assume other geometrical shapes in other embodiments.

As explained above, one or more guide members (e.g., guide rails) are coupled to frame member 40 and serve to retain a light filter inserted into filter frame 28. In the illustrated exemplary embodiment, a first plurality of guide rails 42 is coupled to side 48 by way of fasteners (e.g., screws) 54, and a second plurality of guide rails 43 is coupled to side 52 by way of fasteners (e.g., screws) 56. However, it should be appreciated that guide members 42 may comprise any feature suitable for retaining a received filter within window 41 including, for example, one or more slots formed along an interior portion of frame member 40. Guide rails 42 and 43 extend into window 41 and hold a light filter against another portion (or portions) of filter frame 28 (e.g., side 46 and/or a portion 63 extending into slot 62 described below), bezel 30, or display head housing 38. If desired, sides 48 and 52 may include a plurality of recesses formed therein of the type shown in FIGS. 3 and 4 at 57. Each of these recesses may be sized to receive a different one of the guide rails such that the guide rails form a substantially planar surface with frame member 40 that may be held flush against bezel 30. Frame member 40 may also include a plurality of apertures 58 therethrough configured to accommodate fasteners 36 (FIG. 1), and, perhaps, one or more openings 60 to permit the passage of electrical connections (e.g., wires) between display head 26 and bezel 30 (FIGS. 1 and 2).

A locking feature may be incorporated into filter frame 28 and configured to help retain a light filter within window 41 when the filter has been fully inserted into frame member 40. An exemplary locking feature 44 is illustrated in FIG. 4 as comprising a detent. In particular, locking feature 44 is shown as comprising a spring-biased ball plunger (e.g., plastic, such as nylon). Ball plunger 44 may be mounted within a lower portion of frame member 40 and configured to engage a peripheral portion of a light filter received in frame 28. For example, plunger 44 may be configured such that, when a light filter is inserted through open side 46, plunger 44 contacts the side of the light filter and retracts. After the light filter has been fully inserted into filter frame 28, plunger 44 no longer contacts the side of the light filter and may consequently extend outward to support the filter's lower edge thereby locking the light filter into place until it is manually removed by a user (e.g., a pilot). Of course, it should be understood that a variety of alternative locking features may be utilized in addition to, or in lieu, of a detent, such as a spring biased plunger. Furthermore, it should be appreciated that the locking features may engage a received light filter in manners other than the exemplary manner just described. For example, a locking feature may be configured to engage a depression or opening provided in a peripheral portion of a light filter when fully inserted into filter frame 28.

Figure 5:
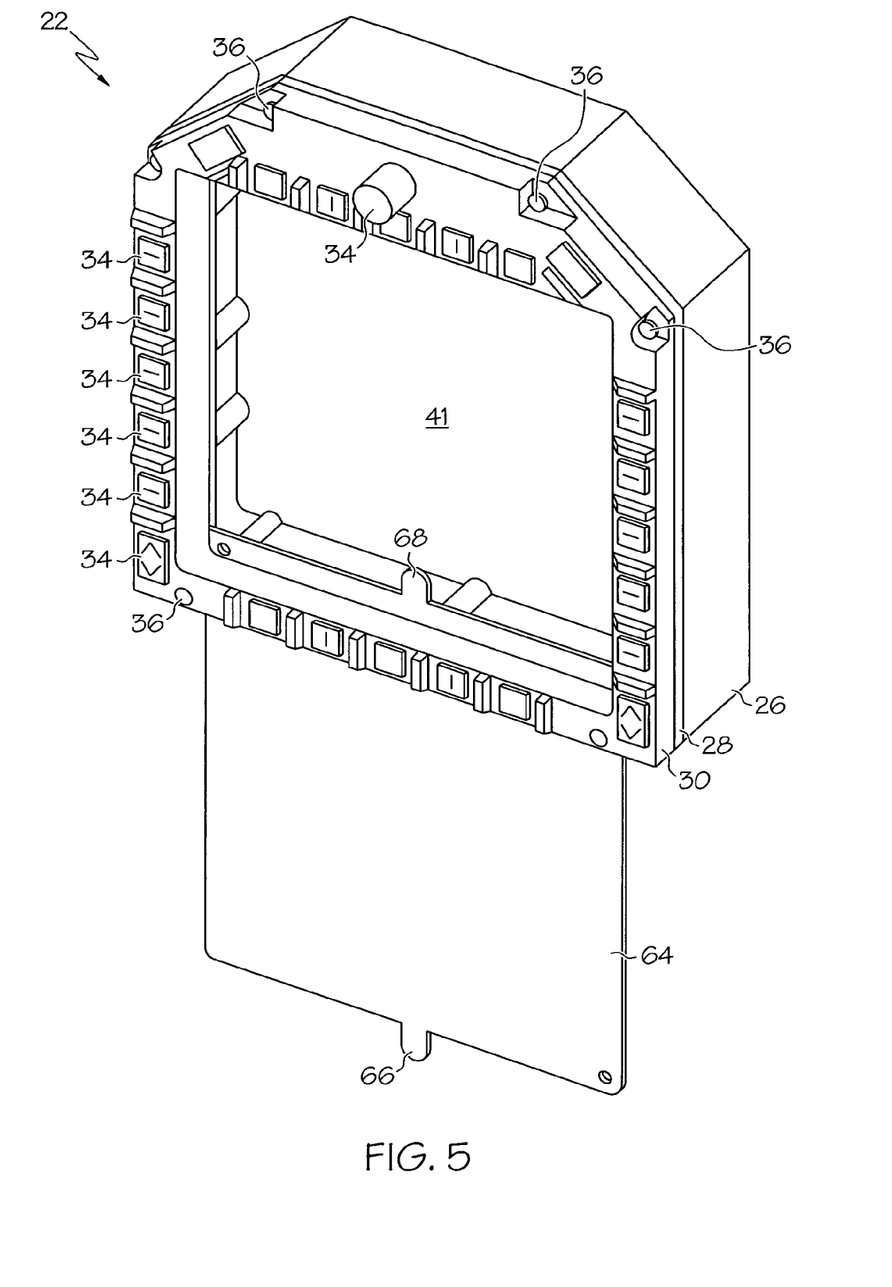
FIG. 5 is an isometric view of the display head assembly shown in FIGS. 1 and 2 illustrating one manner in which an interchangeable light filter may be received therein.

FIG. 5 is an isometric view of display head assembly 22 (display screen 32 is not shown for clarity) illustrating one manner in which filter frame 28 may permit assembly 22 to receive an interchangeable light filter 64. Light filter 64 may include first and second pull tabs 66 and 68. When light filter 64 is fully inserted into display head assembly 22, pull tab 66 (or pull tab 68 depending upon the orientation of filter 64) protrudes from the bottom of assembly 22 and may thus be manually accessed by a user (e.g., a pilot). To remove the light filter 64, the user need only pull downward on pull tab 66 to overcome the latching force of plunger 44 (or other locking feature incorporated into filter frame 28). After light filter 64 has been manually removed, a new light filter may be inserted into display head assembly 22 or light filter 64 may be reoriented (e.g., rotated by 180 degrees) and reinserted into assembly 22. In the latter case, pull tab 68 will protrude from the bottom of assembly 22 when filter 64 is fully inserted into display head assembly 22. A recess 62 (shown in FIG. 3) may be provided in side 50 of frame member 40 to receive tab 68 or tab 66 when light filter 64 is fully inserted into display head assembly 22.

It should be appreciated that the dimensions of window 41 are similar to the dimension of the windows provided through bezel 30 and display head 26 (FIGS. 1 and 2); e.g., the height and width of window 41 may be substantially equivalent to the height and width of the window provided in display head 26. As a result, filter frame 28 does not obstruct the view of display screen 32. Furthermore, the dimensions of filter frame 28 are such that frame 28 may readily mounted between bezel 30 and display head 26; e.g., the height and width of frame member 40 (FIG. 3) may be substantially equivalent to the height and width of bezel 30 and/or display head housing 38. Mounting filter frame 28 between bezel 30 and display head 26, also permits filter frame 28 to hold a received light filter substantially adjacent display screen 32. Also, as indicated above, the dimensions and various features of filter frame 28 permit frame 28 to be easily retrofitted to an existing display head assembly. However, in other embodiments, the bezel and the display head may cooperate to form the filter frame suitable for removably holding a light filter adjacent the display screen. This may be accomplished by, for example, forming the filter frame as an integral part of the display head as described below in conjunction with FIG. 6 or as an integral part of the filter frame with the bezel as described below in conjunction with FIG. 7.

Figure 6:
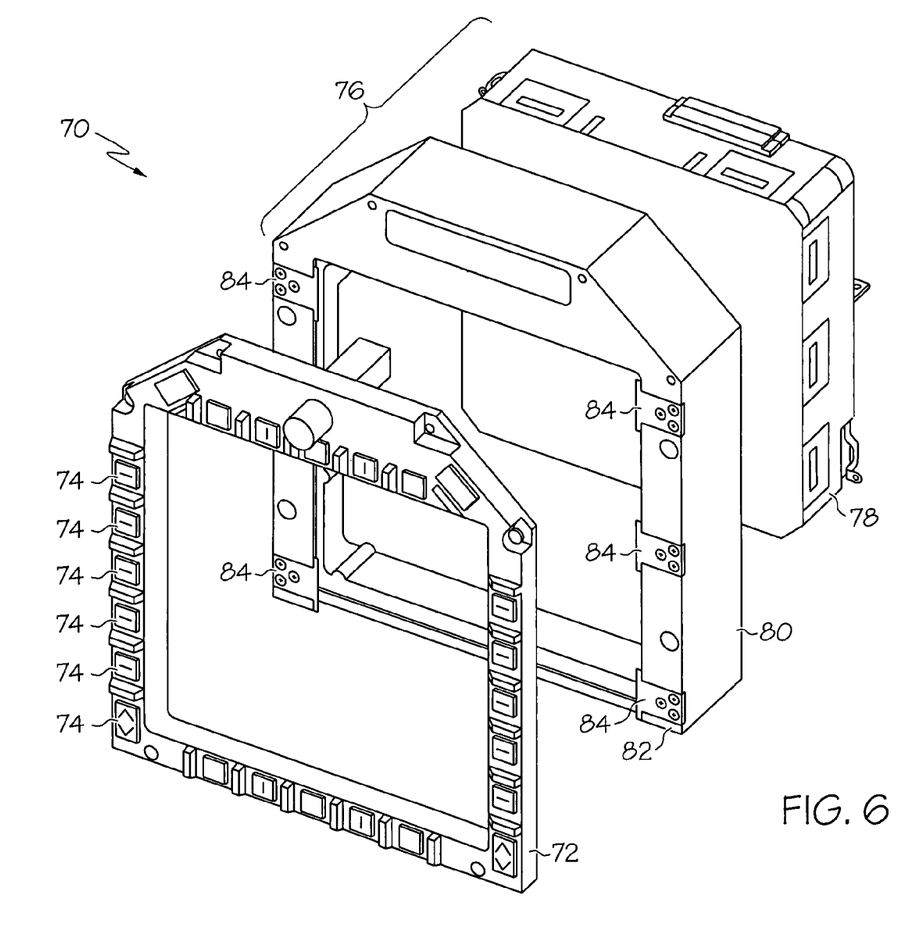
FIG. 6 is an exploded view of a display head assembly wherein the filter frame is integrally formed with the display head housing in accordance with a second exemplary embodiment of the present invention.

FIG. 6 is an exploded view of a display head assembly 70 in accordance with a second exemplary embodiment of the present invention. Head assembly 70 is similar to head assembly 22 shown in FIGS. 1-5; e.g., head assembly 70 comprises a bezel 72 having a plurality of display controls 74 disposed thereon, and a display head 76 including a display head housing 80 and a display screen 78. However, unlike assembly 22, display head assembly 70 does not include an independent filter frame that may be mounted between display head 76 and bezel 72; instead, the filter frame is integrally formed with display head housing 80. That is, a frontal portion of housing 80 comprises a frame member 82 having a plurality of guide members (e.g., guide rails) 84 coupled thereto. An opening is provided through a bottom wall of frame member 82 (and thus through a bottom portion of housing 80) that may accept an interchangeable light filter therethrough. When a light filter is inserted through this opening, guide members 84 hold the filter against an inner wall of housing 80 and adjacent display screen 78. If desired, a locking feature may be incorporated into housing 80 (or into bezel 72), such as a spring-biased ball plunger of the type described above.

Figure 7:
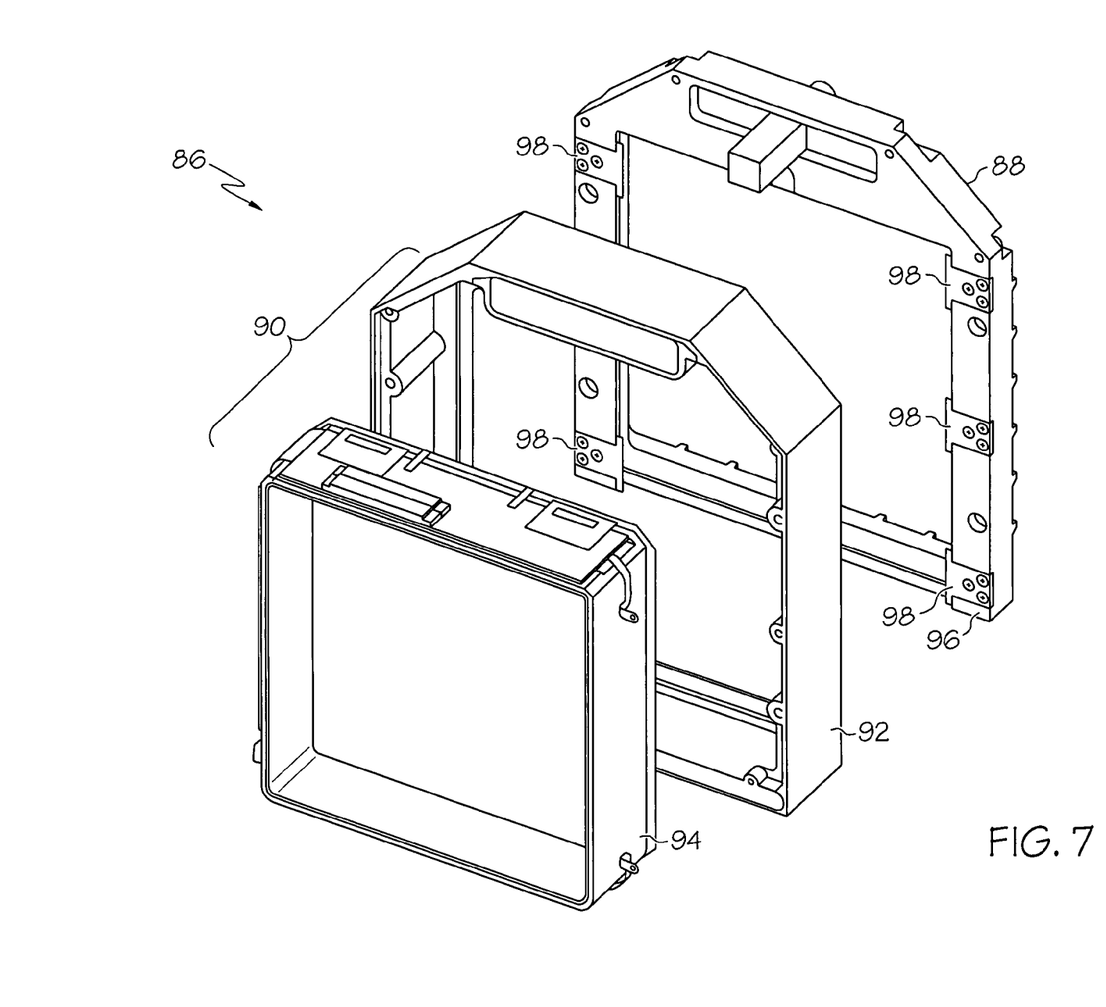
FIG. 7 is an exploded view of a display head assembly wherein the filter frame is integrally formed with the bezel in accordance with a third exemplary embodiment of the present invention.

FIG. 7 is an exploded view of a display head assembly 86 in accordance with a third exemplary embodiment of the present invention. As was the case with assembly 22 (FIGS. 1-5) and assembly 70 (FIG. 6), display head assembly 86 comprises a bezel 88 and a display head 90 including a display head housing 92 and a display screen 94. However, in contrast to display assemblies 22 and 70, a filter frame is integrally formed with a rear portion of bezel 88. The filter frame comprises a frame member 96 and a plurality of guide members 98 attached thereto. An opening is provided through the bottom wall of frame member 96 (and thus through a bottom portion of bezel 88). When bezel 88 is coupled to display head 90, interchangeable light filters may be inserted through this opening and held adjacent display screen 94 by guide members 98 in manner described above.

In view of the above, it should be appreciated that a filter frame capable of being retrofitted to a display head assembly has been provided that may reliably secure a light filter in front of the assembly's display screen and that readily permits manual replacement or reorientation of the light filter. In addition, it should be appreciated that a display head assembly has been also been provided that includes a display head and bezel that cooperate to form a filter frame suitable for removably holding a light filter. While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

The invention claimed is:

1. An avionic display head assembly for use in conjunction with a light filter, the avionic display head assembly comprising:
   a display head;
   a bezel having a plurality of pilot-accessible display controls thereon for control of the display head; and
   a filter frame, comprising:
      a frame member mounted between the display head and the bezel, the frame member having a sidewall opening enabling the manual insertion and withdrawal of the light filter from the frame member, the plurality of pilot-accessible display controls electrically coupled to the display head through the frame member; and
      at least one guide member fixedly coupled to the frame member and configured to engage a peripheral portion of the light filter to retain the light filter within the frame member and adjacent the display head when the light filter is manually inserted through the sidewall opening.

2. An avionic display head assembly according to claim 1 wherein the height and width of the frame member are substantially equivalent to the height and width of the bezel.

3. An avionic display head assembly according to claim 1 wherein the frame member includes a first window therethrough and the display head includes a second window therein, the height and width of the first window being substantially equivalent to the height and width of the second window.

4. An avionic display head assembly according to claim 1 wherein the display head assembly further comprises a display screen mounted in the display head, the frame member configured to hold the light filter adjacent the display screen.

5. An avionic display head assembly according to claim 1 wherein the display head and the bezel are electrically coupled by way of at least one electrical connection, and wherein the frame member includes at least one opening therein receiving the at least one electrical connection therethrough.

6. An avionic display head assembly according to claim 1 further comprising a plurality of fasteners extending through the frame member and joining the bezel and the display head.

7. An avionic display head assembly according to claim 1 wherein the at least one guide member comprises at least one guide rail.

8. An avionic display head assembly according to claim 7 wherein the frame member includes a window therethrough, and wherein the at least one guide rail comprises:
   a first guide rail coupled to a first side of the frame member; and
   a second guide rail coupled to a second side of the frame member substantially opposite the first side, the first guide rail and the second guide rail extending into said window.

9. An avionic display head assembly according to claim 7 wherein the frame member includes at least one recess formed therein sized to receive the at least one guide rail.

10. An avionic display head assembly according to claim 1 further comprising a locking feature coupled to the frame member and configured to secure the light filter within the frame member.

11. An avionic display head assembly according to claim 10 wherein the locking feature comprises a detent configured to engage a peripheral portion of the light filter when fully inserted into the frame member.

12. An avionic display head assembly according to claim 11 wherein the detent is located proximate the sidewall opening.

13. An avionic display head assembly according to claim 11 wherein the detent comprises a spring-biased ball plunger.

14. An avionic display head assembly according to claim 1 wherein the light filter comprises a first pull tab, the frame member configured to permit manual access to the first pull tab when the light filter is fully inserted into the frame member.

15. An avionic display head assembly to claim 14 wherein the light filter comprises a second pull tab, the frame member having a recess therein configured to accommodate the second pull tab when the light filter is fully inserted into the frame member.

16. An avionic display head assembly configured to receive a light filter therein, the avionic display head assembly comprising:
 a display head, comprising:
  a display head housing; and
  a display screen mounted within the display head housing;
 a bezel mounted to the display head and having a plurality of pilot-accessible controls thereon electrically coupled to the display screen;
 a filter frame integrally formed with a rear portion of the bezel and adapted to removably hold the light filter adjacent the display screen; and
 an opening provided through a wall of the bezel and allowing the light filter to be manually interchanged without disassembly of the avionic display head assembly.

* * * * *